(12) United States Patent
Chang

(10) Patent No.: US 12,374,585 B2
(45) Date of Patent: Jul. 29, 2025

(54) METHOD FOR FABRICATING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 501 days.

(21) Appl. No.: 17/954,259

(22) Filed: Sep. 27, 2022

(65) Prior Publication Data

US 2023/0013953 A1 Jan. 19, 2023

Related U.S. Application Data

(63) Continuation of application No. PCT/CN2022/076309, filed on Feb. 15, 2022.

(30) Foreign Application Priority Data

Jul. 19, 2021 (CN) .......................... 202110811858.6

(51) Int. Cl.
  *H01L 21/768* (2006.01)
  *H01L 21/3065* (2006.01)
  *H01L 21/308* (2006.01)

(52) U.S. Cl.
  CPC .. *H01L 21/76898* (2013.01); *H01L 21/30655* (2013.01); *H01L 21/308* (2013.01); *H01L 21/76873* (2013.01)

(58) Field of Classification Search
  CPC ......... H01L 21/76898; H01L 21/30655; H01L 21/308; H01L 21/76873
  See application file for complete search history.

(56) References Cited

U.S. PATENT DOCUMENTS

| 2014/0175663 A1* | 6/2014 | Chen et al. ....... H01L 23/49816 257/774 |
| 2015/0069581 A1* | 3/2015 | Chang et al. ................. 257/622 |

FOREIGN PATENT DOCUMENTS

| CN | 103871956 A | * | 6/2014 | ......... H01L 21/3081 |
| CN | 105140174 A | * | 3/2015 | ....... H01L 21/76819 |

(Continued)

OTHER PUBLICATIONS

Machine translation for Zhang03 (Year: 2017).*

(Continued)

*Primary Examiner* — Christine S. Kim
*Assistant Examiner* — Nathalie R Fayette
(74) *Attorney, Agent, or Firm* — Kilpatrick Townsend & Stockton LLP

(57) ABSTRACT

Embodiments relate to the field of semiconductor manufacturing technology, and more particularly, to a method for fabricating a semiconductor structure, and the semiconductor structure. The method includes: providing a substrate having a connection hole thereon, annular protrusions and annular grooves alternately arranged along a direction parallel to a center line of the connection hole being provided on a hole wall of the connection hole; filling a barrier block in each of the annular grooves; removing the annular protrusions along a direction perpendicular to the hole wall of the connection hole; removing the barrier blocks; and forming a connection layer in the connection hole. After the annular protrusions are removed, roughness of the hole wall of the connection hole is reduced, such that a conductive seed layer is prevented from being broken, thereby avoiding generation of voids in the connection layer, and improving performance of the semiconductor structure.

12 Claims, 3 Drawing Sheets

(56) References Cited

FOREIGN PATENT DOCUMENTS

| | | | | | |
|---|---|---|---|---|---|
| CN | 104282619 | A | * | 12/2015 | ............ H01L 23/481 |
| CN | 106935503 | A | * | 7/2017 | ....... H01L 21/28017 |
| CN | 104282619 | B | | 11/2017 | |
| WO | WO 2017069129 | A1 | * | 4/2017 | ............ B41J 2/1628 |

OTHER PUBLICATIONS

Machine Translation for Tao56 (Year: 2014).*
Machine Translation for Qi19 (Year: 2015).*
Machine Translation for Yao74 (Year: 2015).*

* cited by examiner

METHOD FOR FABRICATING SEMICONDUCTOR STRUCTURE, AND SEMICONDUCTOR STRUCTURE

CROSS-REFERENCE TO RELATED APPLICATION

This application is a continuation of PCT/CN2022/076309, filed on Feb. 15, 2022, which claims priority to Chinese Patent Application No. 202110811858.6 titled "METHOD FOR FABRICATING SEMICONDUCTOR STRUCTURE, AND SEMICONDUCTOR STRUCTURE" and filed to the State Intellectual Property Office on Jul. 19, 2021, the entire contents of which are incorporated herein by reference.

TECHNICAL FIELD

Embodiments of the present disclosure relate to the field of semiconductor manufacturing technology, and more particularly, to a method for fabricating a semiconductor structure, and the semiconductor structure.

BACKGROUND

Electronic devices such as memories generally are provided with semiconductor structures. The semiconductor structure includes a substrate and a wiring layer arranged on the substrate. The wiring layer is a circuit pattern with a certain shape. A contact pad is generally arranged on a side surface of the substrate away from the wiring layer. The substrate is provided with a connection hole, and a connection layer is arranged in the connection hole, where the connection layer is configured to connect the wiring layer and the contact pad arranged on two sides of the substrate.

However, in related technologies, a hole wall of the connection hole is relatively rough, which adversely affects performance of the connection hole, and has a serious adverse effect on performance of the entire semiconductor structure.

SUMMARY

In one aspect, embodiments of the present disclosure provide a method for fabricating a semiconductor structure, including: providing a substrate having a connection hole thereon, annular protrusions and annular grooves alternately arranged along a direction parallel to a center line of the connection hole being provided on a hole wall of the connection hole; filling a barrier block in each of the annular grooves; removing the annular protrusions along a direction perpendicular to the hole wall of the connection hole; removing the barrier blocks; and forming a connection layer in the connection hole.

In another aspect, the embodiments of the present disclosure further provide a semiconductor structure, which is fabricated by means of the above method for fabricating the semiconductor structure.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
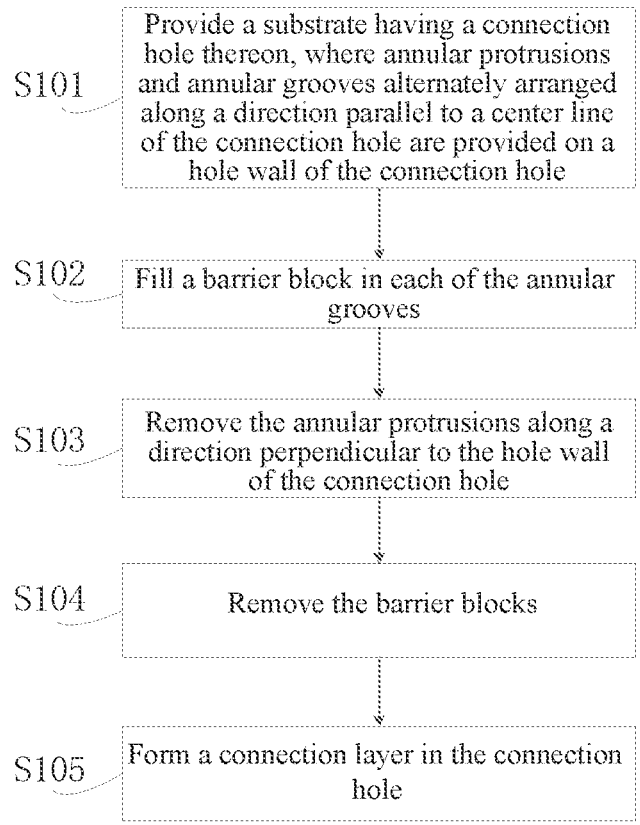
FIG. 1 is a schematic flow diagram of a method for fabricating a semiconductor structure provided by an embodiment of the present disclosure.

To clearly understand the technical solutions of the present disclosure, the solutions of related technologies are first introduced in detail.

In the related technologies, a connection hole is generally formed by means of a Bosch etching process. In some embodiments, it is needed that the mask layer with an etching hole is first formed on a substrate, and then the substrate is etched by using the mask layer as a mask to form a groove on the substrate. Next, a protective layer is deposited on a side wall and a groove bottom of the groove, and the protective layer at the groove bottom of the groove and part of the substrate extending to the groove bottom of the groove are etched by using the mask layer as the mask to increase a depth of the groove. The depth of the groove is increased by means of etching and deposition alternately. After the connection hole is formed, to connect a wiring layer and a contact pad in a semiconductor structure, a composite layer needs to be formed on the hole wall of the connection hole. The composite layer includes, but is not limited to, an insulation layer, a barrier layer, and a conductive seed layer sequentially formed. Next, a connection layer is formed by performing electroplating on the hole wall of the connection hole by means of the conductive seed layer.

However, etching and deposition are alternately performed to form the connection hole, such that the hole wall of the connection hole is provided with annular protrusions and annular grooves alternately arranged along a direction of a center line of the connection hole, and the hole wall of the connection hole is relatively rough. The hole wall with higher roughness may increase difficulty of forming the composite layer, which may cause the composite layer to be broken, such that the subsequently electroplated connection layer likely enters the broken layer, thereby adversely affecting performance of the semiconductor structure.

In view of the above problem, embodiments of the present disclosure provide a method for fabricating a semiconductor structure, and the semiconductor structure. By removing the annular protrusions on the hole wall of the connection hole, the roughness of the hole wall of the connection hole is reduced, and the conductive seed layer is prevented from generating the broken layer, thereby avoiding formation of voids in the connection layer.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

As shown in FIG. 1, the method for fabricating the semiconductor structure provided by the embodiments of the present disclosure includes following steps.

Step S101: providing a substrate having a connection hole thereon, where annular protrusions and annular grooves alternately arranged along a direction parallel to a center line of the connection hole are provided on a hole wall of the connection hole.

Figure 2:
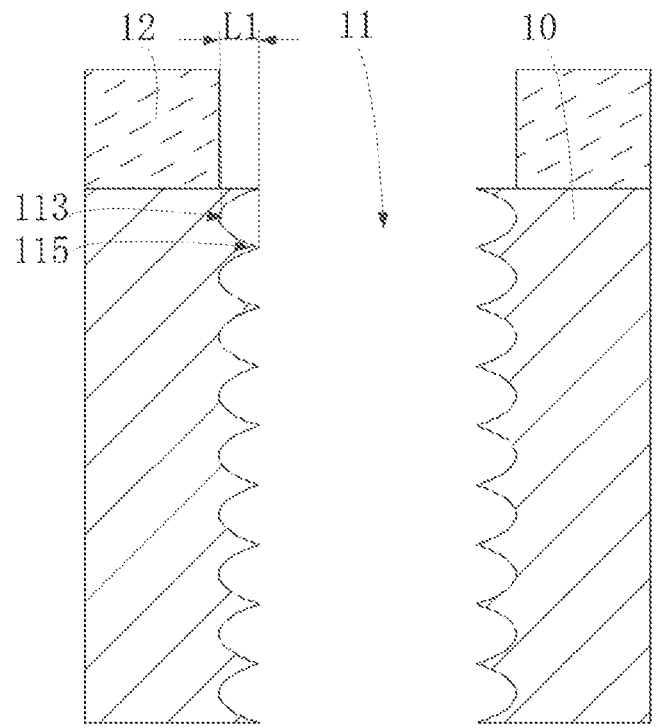
FIG. 2 is a schematic cross-sectional view of a connection hole in the semiconductor structure provided by an embodiment of the present disclosure.

Referring to FIG. 2, in this embodiment, the substrate 10 may be a semiconductor substrate such as single-crystal silicon, polysilicon, or amorphous structure such as silicon or silicon germanium (SiGe), or may be a hybrid semiconductor structure, such as silicon carbide, indium antimonide, lead telluride, indium arsenide, indium phosphide, gallium arsenide or gallium antimonide, an alloy semiconductor, or a combination thereof, which is not limited in this embodiment.

A surface of the substrate 10 is covered with a film layer structure 12, which may be formed after formation of the connection hole 11. The film layer structure 12 may include, for example, an isolation layer configured to protect smaller circuits from being scratched, contaminated, or damped.

For example, with continued reference to FIG. 2, the connection hole 11 is arranged perpendicular to an extension direction of the substrate 10, and the connection hole 11 penetrates through the substrate 10. The connection hole 11 in this embodiment may be formed by means of the Bosch etching process. Of course, in some examples, the connection hole 11 may also be formed by means of processes such as conventional wet etching, conventional dry etching, photo-assisted electrochemical etching, laser drilling, etc., which is not limited here.

In some embodiments, in the embodiment where the connection hole 11 is formed by means of the Bosch etching process, the step of providing the substrate 10 having the connection hole 11 thereon includes: forming a mask layer on the substrate 10, where the mask layer has an etching hole, such that the substrate 10 directly facing the etching hole is removed to form the connection hole 11. A material of the mask layer may include photoresist, amorphous carbon, silicon dioxide, and the like.

After the etching hole is formed, the step of forming the connection hole 11 further includes: etching the substrate 10 by using the mask layer as a mask to form a groove on the substrate 10. In some embodiments, an etching gas may be introduced into the etching hole, the etching gas is decomposed into plasma, and the substrate 10 directly facing the etching hole is etched to form the groove. The etching gas may be, for example, $SF_6$.

After the groove is formed on the substrate 10, the step of forming the connection hole 11 further includes: forming a protective layer on a groove bottom and a groove wall of the groove. In some embodiments, a deposition gas may be introduced into the groove, the deposition gas is decomposed into plasma, and then a polymer is formed on the groove bottom and the groove wall of the groove, where the polymer is the protective layer that can protect the groove wall from being etched subsequently. The deposition gas may include $C_4F_8$, for example.

After the protective layer is formed, the step of forming the connection hole 11 further includes: etching the protective layer corresponding to the groove bottom of the groove and the substrate 10 by using the mask layer as the mask to increase the depth of the groove. In some embodiments, the protective layer covering the groove bottom and part of the substrate 10 covered by the groove bottom may be removed by means of the above etching process, to further increase the depth of the groove.

After the protective layer corresponding to the groove bottom of the groove and the substrate 10 are etched, the step of forming the connection hole 11 further includes: repeatedly forming the protective layer and etching the protective layer corresponding to the groove bottom of the groove and the substrate 10 until the groove penetrates through the substrate 10 to form the connection hole 11. By repeating the above deposition and etching processes, the depth of the groove may be gradually increased until the groove penetrates through the substrate 10 to form the connection hole 11. Of course, the connection hole 11 may also not penetrate through the substrate 10, which is not limited here. It should be noted that the depth of the groove may be controlled by controlling number of times of deposition and etching, and then the connection hole 11 with a certain depth is formed according to actual process requirements.

As shown in FIG. 2, the hole wall of the connection hole 11 is provided with a plurality of annular curved surfaces. A center line of each curved surface is overlapped with the center line of the connection hole 11, a center of circle of the curved surface is positioned inside the connection hole 11, and the plurality of curved surfaces are connected in sequence along the center line of the connection hole 11, such that one end of the curved surface close to the center line of the connection hole 11 is the annular protrusion 115 of the connection hole 11, and one end of the curved surface away from the center line of the connection hole 11 is the annular groove 113 of the connection hole 11. The annular protrusions 115 and the annular grooves 113 are alternately arranged along the direction parallel to the center line of the connection hole 11. In some embodiments, the center line of each annular protrusion 115 and the center line of each annular groove 113 are overlapped with the center line of the connection hole 11. A first pitch L1 is provided between a furthest end and a closest end of each curved surface away from the center line of the connection hole 11 along the direction perpendicular to the hole wall of the connection hole 11.

Step S102: filling a barrier block in each of the annular grooves.

Figure 4:
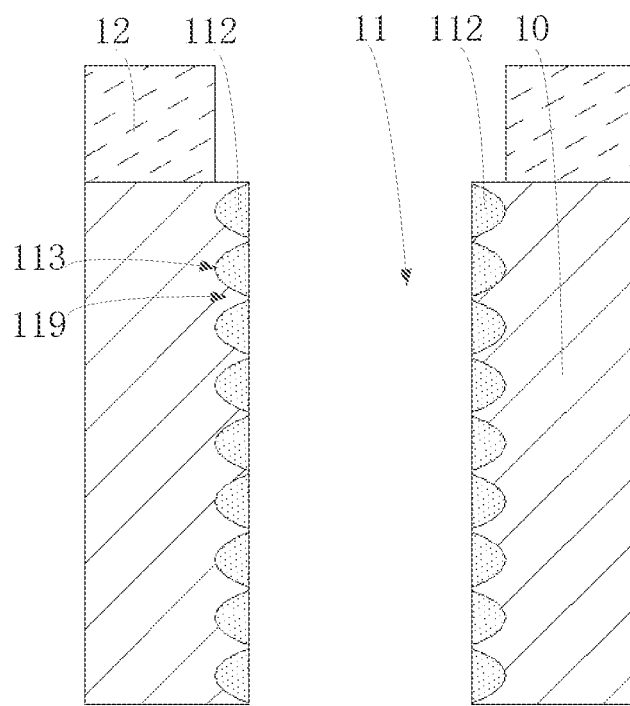
FIG. 4 is a schematic cross-sectional view of forming a barrier block in the connection hole provided by an embodiment of the present disclosure.

In this embodiment, there are a plurality of barrier blocks 112, and each barrier block 112 covers its corresponding annular groove 113 to expose the corresponding annular protrusion 115. For example, referring to FIG. 4, each barrier block 112 is also an annular structure, the center line of the barrier block 112 is overlapped with the center line of the connection hole 11, one end of the barrier block 112 close to the side wall of the connection hole 11 is provided with the curved surface matched with the annular groove 113, and the center of circle of the curved surface is positioned inside the connection hole 11.

Step S103: removing the annular protrusions along the direction perpendicular to the hole wall of the connection hole.

Figure 5:
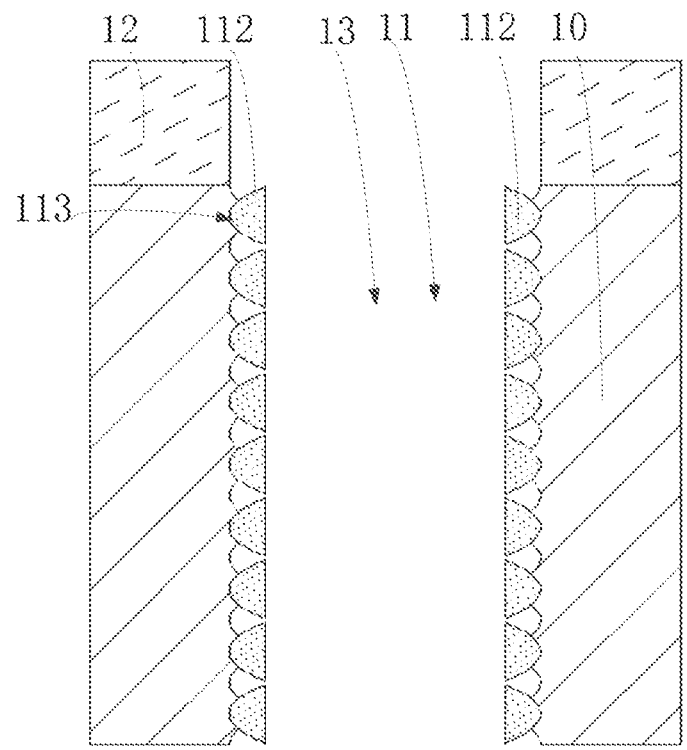
FIG. 5 is a schematic cross-sectional view of removing annular protrusions provided by an embodiment of the present disclosure.

Referring to FIG. 5, the removed annular protrusions 115 extend from the hole wall of the connection hole 11 to outside of the connection hole 11 along the direction perpendicular to the center line of the connection hole 11.

In some embodiments, the annular protrusions 115 may be removed by means of wet etching. In some embodiments, the wet etching is a means of removing a material by means of a chemical reagent. In this embodiment, the chemical reagent may include hot phosphoric acid, hot SC1 cleaning solution, fluorine-containing liquid, and gas, etc. Removing the annular protrusions 115 by means of wet etching is advantageous to reducing difficulty of operation and lowering production costs, thereby facilitating realization of mass production.

It should be noted that the annular protrusion 115 has higher etching selectivity than the barrier block 112, such that when the annular protrusions 115 are removed by means of wet etching, the annular protrusions 115 are etched away before the barrier blocks 112, and the barrier blocks 112 can always cover the annular grooves 113 to prevent the annular grooves 113 from being etched, thereby reducing the roughness of the hole wall of the connection hole 11.

Step S104: removing the barrier block.

Figure 6:
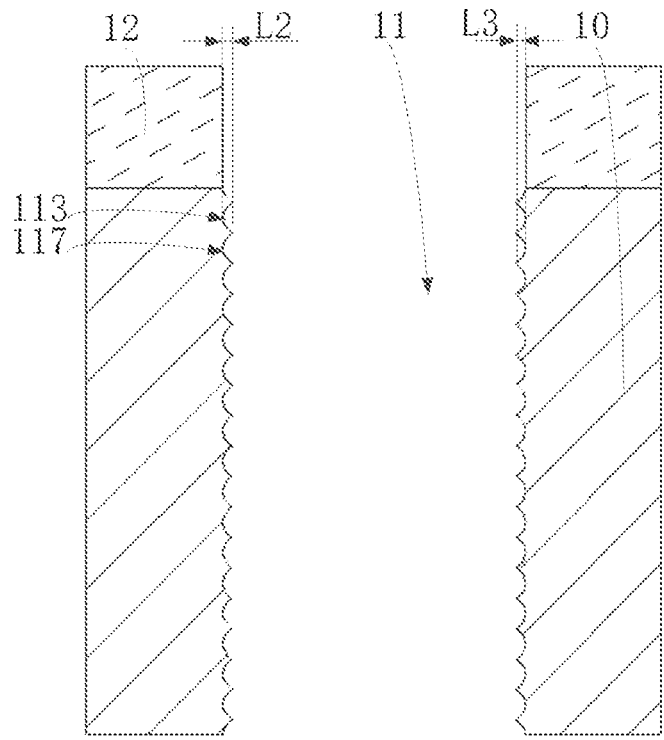
FIG. 6 is a schematic cross-sectional view of removing the barrier block provided by an embodiment of the present disclosure.

After the barrier blocks 112 are removed, that is, the barrier material 111 covering the hole wall of the connection hole 11 is removed, the hole wall of the connection hole 11 is completely exposed. Referring to FIG. 6, the roughness of the hole wall of the connection hole 11 is lower than the roughness of the hole wall in FIG. 2. In some embodiments, the hole wall of the connection hole 11 is provided with the plurality of annular curved surfaces, the center line of each curved surface is overlapped with the center line of the connection hole 11, the center of circle of the curved surface is positioned inside the connection hole 11, and the plurality of curved surfaces are sequentially connected along the center line of the connection hole 11. The pitch between the furthest end and the closest end of each curved surface away from the center line of the connection hole 11 along the direction perpendicular to the hole wall of the connection hole 11 is smaller than the first pitch L1, which facilitates subsequent coverage of another material on the hole wall and reduces the difficulty of fabrication.

Step S105, forming a connection layer on the connection hole.

A material of the connection layer may include a conductive material, such that structures at two ends of the connection hole 11 are electrically connected via the connection hole 11. In an embodiment, the conductive seed layer may be formed on the hole wall of the connection hole 11 first, and then electroplating is performed by using the conductive seed layer as the electrode to form the connection layer.

In some embodiments, before the connection layer is formed in the connection hole 11, the method further includes: forming the insulation layer on the hole wall of the connection hole 11. In a possible embodiment, the insulation layer may be formed on the hole wall of the connection hole 11 by means of a deposition process. A material of the insulation layer may include, for example, oxide such as silicon dioxide. In addition, silicon atoms on the surface of the hole wall of the connection hole 11 may completely react at high temperature by means of thermal oxidation diffusion to form silicon dioxide.

After the insulation layer is formed on the hole wall of the connection hole 11, the method further includes: forming the diffusion barrier layer, the diffusion barrier layer covering the insulation layer. The diffusion barrier layer is configured to prevent the material of the connection layer from diffusing through the insulation layer. For the diffusion barrier layer, one or more materials of Ta, TaN, Ti, and TiN may be used as a target material by means of an ion implantation process. Under the condition that various materials are used, the various materials may be simultaneously included in one target material, or a plurality of target materials may be used, where each target material includes one or more materials.

In this embodiment, after the diffusion barrier layer is formed, the step of forming the connection layer in the connection hole 11 includes: forming the conductive seed layer in the connection hole 11 to facilitate subsequent formation of the connection layer.

In a possible embodiment, the conductive seed layer may be formed by means of a sputtering process to facilitate subsequent formation of the connection layer on the basis of the conductive seed layer. In a possible embodiment, a material of the conductive seed layer may include copper, silver, titanium, nickel, etc.

After the conductive seed layer is formed, the step of forming the connection layer in the connection hole 11 further includes: performing electroplating in the connection hole 11 via the conductive seed layer to form the connection layer. It should be noted that the electroplating process is high in fabrication speed and low in cost, and the thickness of an electroplating material is easily controlled by controlling process parameters of electroplating. It should be noted that when the connection layer is formed by means of the electroplating process, the connection layer has the same material as the conductive seed layer. For example, in the embodiment that the conductive seed layer is the copper seed layer, it is needed that the copper is electroplated by using the copper seed layer as the electrode to form the connection layer. Of course, in some other examples, the connection layer may also be formed by means of chemical plating or vacuum evaporation coating.

The method for fabricating the semiconductor structure provided by the embodiments of the present disclosure includes: providing a substrate 10 having a connection hole 11 thereon, where annular protrusions 115 and annular grooves 113 alternately arranged along a direction parallel to a center line of the connection hole 11 are provided on a hole wall of the connection hole 11; filling a barrier block 112 in each of the annular grooves 113; removing the annular protrusions 115 along a direction perpendicular to the hole wall of the connection hole 11; removing the barrier blocks 112; and forming a connection layer in the connection hole 11. After the annular protrusions 115 are removed, roughness of the hole wall of the connection hole 11 is reduced, such that a conductive seed layer is prevented from being broken, thereby avoiding generation of voids in the connection layer, and improving performance of the semiconductor structure.

In some embodiments, in the method for fabricating the semiconductor structure provided in this embodiment, the filling the barrier block 112 in each of the annular grooves 113 includes: filling the connection hole 11 with a barrier material 111, such that the barrier material 111 fills up the connection hole 11.

By filling the barrier material 111, it is convenient to form the barrier block 112 subsequently by removing part of the barrier material 111. In this embodiment, the barrier material 111 may be filled in the connection hole 11 by means of a coating process, such that the barrier material 111 is attached to the hole wall of the connection hole 11.

Figure 3:
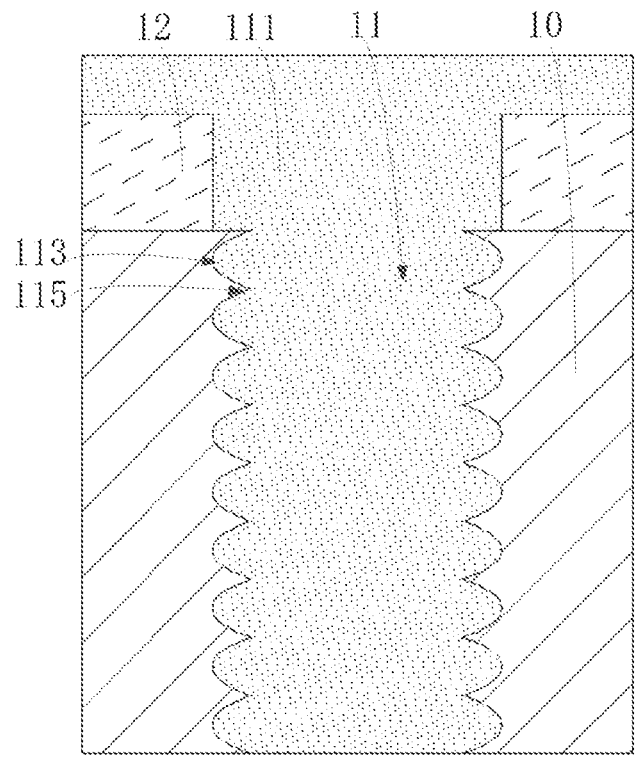
FIG. 3 is a schematic cross-sectional view of filling a barrier material in the connection hole provided by an embodiment of the present disclosure.

For example, as shown in FIG. 3, when filling the connection hole 11 with the barrier material 111, such that the barrier material 111 fills up the connection hole 11, the method also includes: the barrier material 111 also covering the surface of the substrate 10.

When the barrier material 111 is filled by means of a coating process, the barrier material 111 may be directly formed on the surface of the substrate 10, such that the barrier material 111 can be filled in the connection hole 11 and can also cover the surface of the substrate 10 outside the connection hole 11, which is advantageous to improving efficiency of processing, reducing difficulty of processing, and facilitating the realization of mass production.

In some embodiments, the barrier material 111 includes the photoresist. Subsequent removal of a photoresist material is simple, which is advantageous to forming a via hole 13 subsequently, and improving the efficiency of processing.

In some embodiments, after the barrier material 111 is filled in the connection hole 11, filling the barrier block 112 in each of the annular grooves 113 further includes: removing part of the barrier material 111 to form the via hole 13, where a center line of the via hole 13 is collinear with the center line of the connection hole 11, and a hole wall of the via hole 13 is bonded to the annular protrusions 115.

For example, the annular protrusions 115 are spaced on the hole wall of the via hole 13. By forming the via hole 13, the hole wall of the connection hole 11 is flattened by removing part of the hole wall of the via hole 13 subsequently.

In some embodiments, while removing part of the barrier material 111 to form the via hole 13, the method also includes: removing ends of the annular protrusions 115 towards the center line of the connection hole 11 to form a remaining portion 119. For example, referring to FIG. 4, one end of the remaining portion 119 close to the center line of the connection hole 11 is flush with the hole wall of the via hole 13, and one end of the remaining portion 119 close to the center line of the connection hole 11 is flush with one end of each barrier block 112 close to the center line of the connection hole 11. That is, the remaining portion 119 is exposed between two adjacent barrier blocks 112, thereby facilitating subsequent removal of the remaining portion 119.

In the embodiment where each annular protrusion 115 has higher etching selectivity than each barrier block 112, an end of the annular protrusion 115 towards the center line of the connection hole 11 may also not be removed. In this case, on the hole wall of the via hole 13 formed, the end of the annular protrusion 115 towards the center line of the connection hole 11 protrudes from between the two adjacent barrier blocks. When the annular protrusions 115 are removed subsequently, because each annular protrusion 115 has higher etching selectivity than each barrier block 112, the annular protrusions 115 are etched away before the barrier blocks 112, such that the barrier blocks 112 can always cover the annular grooves 113 to avoid etching the annular grooves 113, thereby reducing the roughness of the hole wall of the connection hole 11.

In some embodiments, in the embodiment that the barrier material 111 includes the photoresist, part of the barrier material 111 may be removed by means of exposure and development to form the via hole 13.

In some embodiments, the barrier material 111 is a positive photoresist, a photomask with a positive pattern is formed on a surface of the photoresist, and an opening of the positive pattern exposes part of the connection hole 11. Further, a projection of the opening of the positive pattern on the substrate 10 covers part of the connection hole 11. The positive photoresist is exposed via the photomask. That is, part of the barrier material 111 inside the connection hole 11 is exposed and melted in positive developing solution to form the via hole 13.

In some embodiments, in the embodiment of removing the ends of the annular protrusions 115 towards the center line of the connection hole 11, before the remaining portion 119 is etched along the direction perpendicular to the hole wall of the connection hole 11, the method further includes: removing the barrier material 111 positioned on the surface of the substrate 10, thereby affecting the removal of the remaining portion 119. Furthermore, removing the barrier material 111 on the surface of the substrate 10 is also advantageous to avoiding subsequent formation of other film layers on the surface of the substrate 10.

In some embodiments, in the embodiment of removing the ends of the annular protrusions 115 towards the center line of the connection hole 11, the etching the remaining portion 119 along the direction perpendicular to the hole wall of the connection hole 11 includes: etching the remaining portion 119 along the direction perpendicular to the hole wall of the connection hole 11 to form annular recesses 117 on the hole wall of the connection hole 11; and ensuring the depth of each recess 117 and the depth of each annular groove 113 not to be greater than a preset depth.

Referring to FIG. 5 and FIG. 6, for example, each annular recess 117 is an annular curved surface, the center line of each curved surface is overlapped with the center line of the connection hole 11, the center of circle of the curved surface is positioned inside the connection hole 11, the plurality of curved surfaces are connected in sequence along the center line of the connection hole 11, a third pitch L3 is provided between the furthest end and the closest end of the curved surface of the recess 117 away from the center line of the connection hole 11 along the direction perpendicular to the hole wall of the connection hole 11, where the third pitch L3 is the depth of the recess 117. Similarly, a second pitch L2 is provided between the furthest end and the closest end of the curved surface of each annular groove 113 away from the center line of the connection hole 11 along the direction perpendicular to the hole wall of the connection hole 11, where the second pitch L2 is the depth of the annular groove 113. It should be noted that the depth of each recess 117 and the depth of each annular groove 113 are not greater than the preset depth, to prevent adversely affecting the subsequent formation of other film layers on the hole wall.

In some embodiments, the preset depth is 1 nm to 10 nm, such that subsequent fabrication by means of other processes on the hole wall is further prevented from being adversely affected, and thus the performance of the connection hole 11 is further improved.

In some embodiments, after the connection layer is formed in the connection hole 11, the method further includes: forming, on a side of the substrate 10, a wiring layer bonded to the connection layer. The wiring layer may be formed by means of electroplating or deposition, and the semiconductor structure is electrically connected to an external device via the wiring layer, thereby implementing functions of the semiconductor structure.

In some embodiments, after the connection layer is formed in the connection hole 11, the method further includes: forming, on other side of the substrate 10, a contact pad bonded to the connection layer. A material of the contact pad may include tungsten or copper, and the contact pad can serve as a soldering point for chip packaging.

In the embodiment where the connection hole 11 does not penetrate through the substrate 10, after the connection hole 11 having a certain depth is formed, a side of the substrate

10 away from the connection hole 11 may be thinned to expose the connection layer in the connection hole 11, and then the contact pad bonded to the connection layer is formed on the other side of the substrate 10, such that the contact pad is connected to the wiring layer via the connection layer. In some embodiments, the substrate 10 may be thinned by means of etching or chemical mechanical polishing.

The embodiments of the present disclosure further provide a semiconductor structure, which is fabricated by means of the above method for fabricating the semiconductor structure.

The semiconductor structure includes a substrate 10 having a connection hole 11 thereon, recesses 117 and annular grooves 113 alternately arranged along the direction parallel to the center line of the connection hole 11 are provided on the hole wall of the connection hole 11, and the connection layer is also provided on the hole wall of the connection hole 11. The process of forming the recesses 117 includes: providing, on the hole wall of the connection hole 11, the annular protrusions 115 and the annular grooves 113 alternately arranged along the direction parallel to the center line of the connection hole 11; filling the barrier block 112 in each of the annular grooves 113; removing the annular protrusions 115 on the connection hole 11 along the direction perpendicular to the hole wall of the connection hole 11; removing the annular protrusions 115 on the connection hole 11, and then removing the barrier blocks 112 and the recesses 117. After the annular protrusions 115 are removed, roughness of the hole wall of the connection hole 11 is reduced, such that a conductive seed layer is prevented from being broken, thereby avoiding generation of voids in the connection layer, and improving performance of the semiconductor structure.

Those skilled in the art may clearly understand that for the convenience and brevity of description, division of the above functional modules is merely taken as an example for illustration. In actual applications, the foregoing functions may be allocated to different functional modules and implemented according to needs. That is, an internal structure of an apparatus is divided into different functional modules to implement all or a part of the functions described above. For a detailed working process of the apparatus described above, reference may be made to the corresponding process in the foregoing method embodiments, and details are not described herein again.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:
    providing a substrate having a connection hole thereon, annular protrusions and annular grooves alternately arranged along a direction parallel to a center line of the connection hole being provided on a hole wall of the connection hole;
    filling a barrier block in each of the annular grooves;
    etching the annular protrusions along a direction perpendicular to the hole wall of the connection hole;
    removing the barrier blocks; and
    forming a connection layer in the connection hole;
    wherein the etching the annular protrusions along the direction perpendicular to the hole wall of the connection hole comprises:
    etching the annular protrusions along the direction perpendicular to the hole wall of the connection hole to form annular recesses on the hole wall of the connection hole; and ensuring a depth of each of the recesses and a depth of each of the annular grooves not to be greater than a preset depth.

2. The method for fabricating the semiconductor structure according to claim 1, wherein the filling the barrier block in each of the annular grooves comprises:
    filling a barrier material in the connection hole, such that the barrier material fills up the connection hole; and
    removing part of the barrier material to form a via hole, a center line of the via hole being collinear with the center line of the connection hole, and a hole wall of the via hole being bonded to the annular protrusions.

3. The method for fabricating the semiconductor structure according to claim 2, wherein while part of the barrier material is removed to form the via hole, ends of the annular protrusions towards the center line of the connection hole are removed.

4. The method for fabricating the semiconductor structure according to claim 2, wherein the barrier material comprises a photoresist.

5. The method for fabricating the semiconductor structure according to claim 4, wherein part of the barrier material is removed by means of exposure and development to form the via hole.

6. The method for fabricating the semiconductor structure according to claim 2, wherein the filling the barrier material in the connection hole, such that the barrier material fills up the connection hole comprises:
    the barrier material further covering a surface of the substrate; wherein
    before etching the annular protrusions along the direction perpendicular to the hole wall of the connection hole, the method further comprises: removing the barrier material positioned on the surface of the substrate.

7. The method for fabricating the semiconductor structure according to claim 1, wherein the annular protrusions are removed by means of wet etching.

8. The method for fabricating the semiconductor structure according to claim 1, wherein the preset depth is 1 nm to 10 nm.

9. The method for fabricating the semiconductor structure according to claim 1, wherein the forming the connection layer in the connection hole comprises:
    forming a conductive seed layer in the connection hole by means of a sputtering process; and
    performing electroplating on the hole wall of the connection hole by using the conductive seed layer as an electrode to form the connection layer.

10. The method for fabricating the semiconductor structure according to claim 1, wherein the providing the substrate having the connection hole thereon comprises:
    forming a mask layer on the substrate, the mask layer having an etching hole;
    etching the substrate by using the mask layer as a mask to form a groove in the substrate;
    forming a protective layer on a groove bottom and a groove wall of the groove;

etching the protective layer corresponding to the groove bottom of the groove and the substrate by using the mask layer as the mask to increase a depth of the groove; and repeatedly forming the protective layer and etching the protective layer corresponding to the groove bottom of the groove and the substrate until the groove penetrates through the substrate to form the connection hole.

11. The method for fabricating the semiconductor structure according to claim 1, wherein after forming the connection layer in the connection hole, the method further comprises:

forming, on a side of the substrate, a wiring layer bonded to the connection layer.

12. The method for fabricating the semiconductor structure according to claim 11, wherein after forming the connection layer in the connection hole, the method further comprises:

forming, on another side of the substrate, a contact pad bonded to the connection layer.

* * * * *